United States Patent [19]
Walker et al.

[11] Patent Number: 6,090,300
[45] Date of Patent: Jul. 18, 2000

[54] ION-IMPLANTATION ASSISTED WET CHEMICAL ETCHING OF III-V NITRIDES AND ALLOYS

[75] Inventors: Jack Walker, Sunnyvale; Werner Goetz, Palo Alto; Noble M. Johnson, Menlo Park; David P. Bour, Cupertino; Thomas L. Paoli, Los Altos, all of Calif.

[73] Assignee: Xerox Corporation, Stamford, Conn.

[21] Appl. No.: 09/084,223

[22] Filed: May 26, 1998

[51] Int. Cl.⁷ .......................... H01L 21/3115; B44C 1/22
[52] U.S. Cl. .................................. 216/2; 216/65; 216/67; 445/35; 445/50
[58] Field of Search .................... 216/65, 2, 67; 445/35, 50; 438/33, 46, 18; 156/643.1, 662.1

[56] References Cited

U.S. PATENT DOCUMENTS

| | | | |
|---|---|---|---|
| 4,902,635 | 2/1990 | Imamura | 438/523 |
| 5,001,076 | 3/1991 | Mikkelson | 438/174 |
| 5,236,547 | 8/1993 | Takahashi | 438/498 |
| 5,384,285 | 1/1995 | Sitaram | 438/664 |
| 5,413,953 | 5/1995 | Chien | 438/443 |
| 5,536,360 | 7/1996 | Nguyen | 216/96 |
| 5,693,180 | 12/1997 | Furukawa | 156/643.1 |
| 5,705,830 | 1/1998 | Siergieg | 257/77 |
| 5,741,431 | 4/1998 | Shih | 216/65 |
| 5,789,265 | 8/1998 | Nitta | 437/228 |
| 5,814,533 | 9/1998 | Shakuda | 438/46 |
| 5,834,325 | 11/1998 | Motoki | 438/22 |
| 5,846,844 | 12/1998 | Asasaki | 437/21 |
| 5,866,925 | 2/1999 | Zolper | 257/279 |
| 5,895,223 | 4/1999 | Peng | 438/18 |

*Primary Examiner*—Maria Nuzzolillo
*Assistant Examiner*—Mark Ruthkosky
*Attorney, Agent, or Firm*—Oliff & Berridge, PLC

[57] ABSTRACT

A process for etching III–V nitride and III–V nitride alloy materials first implants selected regions of the materials with ions and then selectively etches the implanted regions in an etching liquid, such as an aqueous base. The etch depth is controlled by the energy, mass and dose of the implanted ions.

21 Claims, 4 Drawing Sheets

ION-IMPLANTATION ASSISTED WET CHEMICAL ETCHING OF III-V NITRIDES AND ALLOYS

BACKGROUND OF THE INVENTION

1. Field of Invention

This invention relates to etching processes. More specifically, this invention relates to processes for wet chemical etching ion-implanted III–V nitride and III–V nitride alloy films.

2. Description of Related Art

Blue light emitting diodes and blue laser diodes are important for many uses, including printing, data storage, medical technology and displays. Gallium nitride ("GaN") and aluminum gallium indium nitride ("AlGaInN") alloys are being developed for visible and UV light emitters, and for high temperature electronic devices. High quality GaN films have been obtained by epitaxial deposition on sapphire substrates, leading to efficient blue and green light emitting diodes. Such GaN films are currently being incorporated into heterojunction laser diodes.

For the development and fabrication of devices emitting blue or green light, a high quality technique for controllably removing III–V nitride material after growth is essential. For example, to fabricate laser diodes from III–V nitride semiconductors, the formation of either mesa structures from multilayer nitride films, as shown in FIG. 2D, or facets will be necessary.

To date, primarily dry chemical etching techniques have been employed to etch III–V nitride materials. For example, processes involving reactive ion etching ("RIE") with plasmas of various chlorine containing gases have been demonstrated. More effectively, nitrides are etched by chemically assisted ion beam etching ("CAIBE"), using an Ar ion beam in combination with proximity injection of a chlorine-containing gas. However, these techniques require a substantial investment in equipment and technique and are usually not justifiable in the early research stage of the development of III–V nitride based devices.

It has been found that GaN is chemically resistant to most of the acids and bases that are commonly used in the semiconductor technology. For example, GaN is not affected when exposed to boiling aqua regia or HF. Similarly, GaN material of low crystalline quality having donors in excess of $10^{19}$ cm$^{-3}$ is etched only very slowly by hot sodium hydroxide (NaOH) or potassium hydroxide (KOH).

There is a need for a process for chemically etching III–V nitride and III–V nitride alloy materials.

SUMMARY OF THE INVENTION

The present invention provides a process for etching high quality III–V nitride and III–V nitride alloy films. According to the present invention, a III–V nitride or alloy film is ion implanted in selected regions using conventional patterning and ion implantation techniques. When the implanted film is exposed to an aqueous base, the ion implanted nitride regions etch substantially faster than the non-implanted nitride regions. The etch depth in the implanted regions of the nitride film can be controlled by the energy, mass and dose of the ions implanted in the film. The difference in etch rates between the implanted and non-implanted regions results in a flexible process for etching patterns in III–V nitrides and III–V nitride alloys.

These and other features and advantages of the present invention are described in, or are apparent from, the following detailed description of the preferred embodiments.

BRIEF DESCRIPTION OF THE DRAWINGS

The preferred embodiments of this invention will be described in detail, with reference to the following figures, wherein.

DETAILED DESCRIPTION OF PREFERRED EMBODIMENTS

Figure 1:
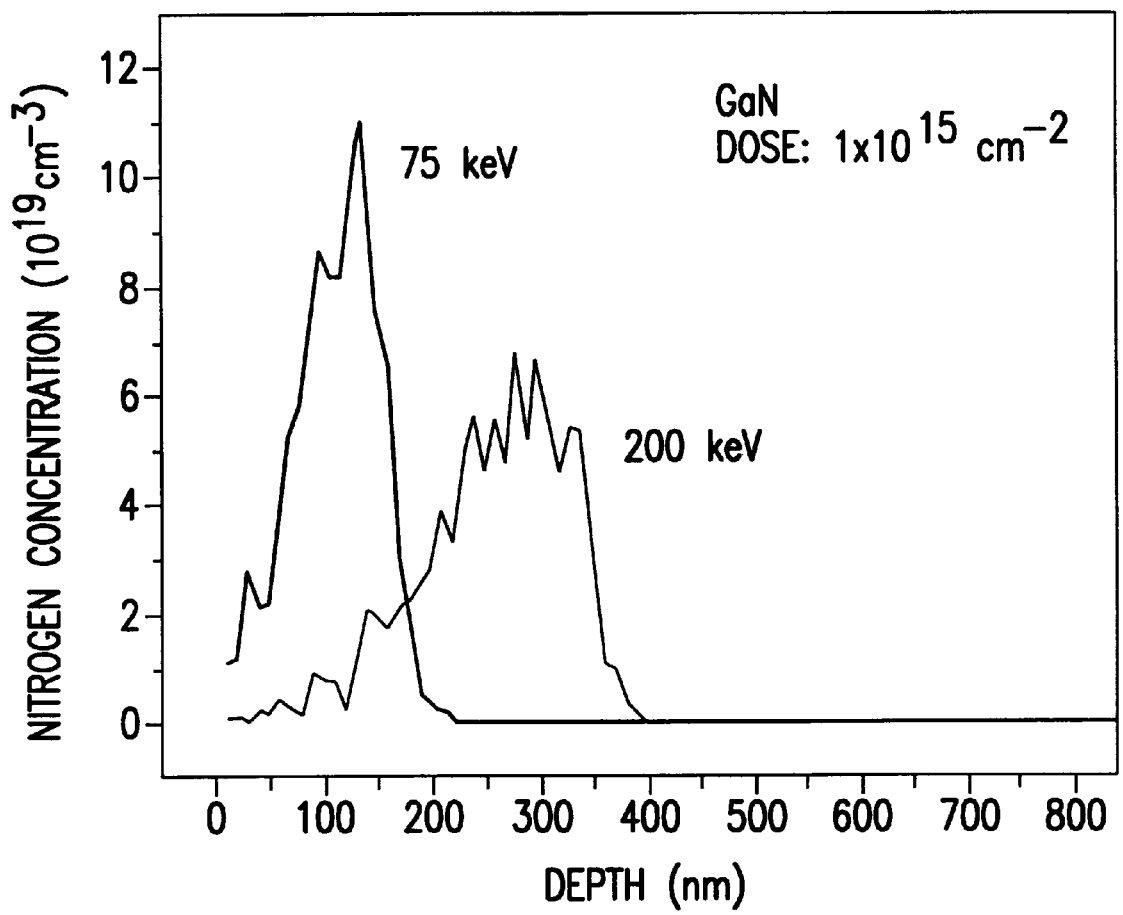
FIG. 1 shows the calculated concentration versus depth profile of nitrogen ions implanted in GaN under specific implantation conditions.

The present invention provides a cost-effective process for etching films of III–V nitrides and III–V nitride alloys (hereinafter collectively referred to as "nitride films") that allows laterally defined removal of material from selected regions of the films. The process implants ions in selected regions of nitride films prior to etching the implanted regions with etching liquids. The etching liquid is typically an aqueous base.

The term "III–V nitride" as used herein refers to nitrides formed from elements of Group III and Group V of the periodic table. An example of a III–V nitride is GaN. Non-stoichiometric gallium nitride can also be generically referred to as "GaN". In embodiments of the present invention, GaN is preferred as the III–V nitride.

The term "III–V nitride alloy" as used herein refers to nitride alloys formed from elements of Group III and Group V of the periodic table. Examples of III–V nitride alloys include AlGaN, InGaN and AlGaInN. Non-stoichiometric aluminum gallium indium nitride can also be generically referred to as "AlGaInN". In embodiments of the present invention, AlGaInN is preferred as the III–V nitride alloy.

The etching process of the present invention includes steps of providing a nitride film, implanting selected regions of the film with ions to form an ion implanted film, and etching the ion implanted film in an etching liquid to selectively etch the implanted regions of the film. Ion-implantation is a conventional technique. Ion-implantation capabilities are presently available in many laboratories or can be obtained from private companies.

The III–V nitride film can be undoped. Alternatively, in embodiments the nitride film can be doped p-type or n-type by conventional processes. Examples of p-type dopants include, but are not limited to, Mg, Ca, C and Be. Examples of n-type dopants include, but are not limited to, Si, O, Se, Te and N-vacancies.

When the nitride film is implanted with ions, a portion of the film can be protected from ion implantation by a mask. The mask can be, for example, a layer of resist on a surface of the film. The layer of resist forming the mask can be patterned using conventional techniques, including photolithography, x-ray lithography, electron beam lithography and ion beam lithography. When photolithographic patterning techniques are used, the layer of resist forming the mask can be photoresist. In other embodiments, the mask can be a patterned stencil positioned adjacent to the substrate. The patterned stencil can be made of metal.

Ions can be implanted in the nitride film by directing an ion beam to the film. The ion beam can be focused on the film, as in conventional ion beam lithography.

While not wishing to be limited by any theory, it is believed that the etching of the nitride films according to the invention is enabled by displacement damage approaching amorphization of the nitride film material and is not dependent on the implanted species. Thus, the ions implanted in the nitride film can be elemental ions or molecular ions. For example, elemental ions including, but not limited to Al, Ga, In, Si, O, N, Mg, Zn, $^2$H, H and He ions can be implanted. It is advantageous that the implanted ions be formed from elements that are constituents of the nitride film into which the ions are implanted, so that any implanted ions that may remain in the nitride film after etching do not contaminate the unetched regions of the nitride film. For example, N can be implanted in a nitride film without risk of introducing impurities into the film. Similarly, Ga can be implanted into GaN films, and any one of Al, Ga, and In can be implanted in AlGaInN films, without risk of introducing impurities into the respective films.

Ion implantation can implant ions having a wide variety of energies. The etch depth of implanted substrates may be controlled by the energy, mass and dose of the implanted ions. These process parameters can, of course, be varied depending upon such factors as the desired etch depth and the type of material being implanted. In embodiments, the energy of the implanted ions can range from about 5 keV to about 5000 keV. In other embodiments, the energy of the implanted ions can range from about 75 keV to about 200 keV.

The dose of ions implanted in a nitride film can range between about $10^{11}$ ions/cm$^2$ and about $10^{18}$ ions/cm$^2$. In embodiments, the dose can range between about $10^{14}$ ions/cm$^2$ and about $10^{15}$ ions/cm$^2$.

FIG. 1 shows a calculated concentration versus depth profile when 75 keV and 200 keV nitrogen ions are implanted into a GaN substrate. The dose for both implantation energies was $10^{15}$ ions/cm$^2$.

After implantation, the mask can be removed from the nitride film and the film can be exposed to an etching liquid to etch away ion implanted regions of the film. The etching liquid can include, but is not limited to, an aqueous base. The aqueous base can be, for example, aqueous sodium hydroxide or aqueous potassium hydroxide.

It is not necessary to mask the non-implanted regions of the nitride film during exposure to the etching liquid. This is because, under the etching conditions of the present invention, the etching process stops near the projected range of implanted ions in ion-implanted regions, but does not substantially etch any of the non-implanted regions.

When etching an implanted nitride film in an etching liquid, the etching liquid is preferably maintained at or above a temperature of about 25° C. More preferably, the etching liquid is maintained at a temperature between about 25° C. and about 400° C. In embodiments, the etching liquid can be maintained at a temperature of about 100° C.

After wet etching, the etched side wall of nitride film can be smooth enough to act as a mirror for a laser cavity. Alternatively, shallow etched mesas formed according to the present invention can be used to form lateral waveguides for laser structures.

In embodiments of the invention, variation of the implantation energy, mass and dose in adjacent portions of implanted regions can result, after etching, in etched trenches exhibiting patterned irregularities or roughness. This roughness can be favorable for the fabrication of ohmic contacts.

EXAMPLE 1

Figure 2A:
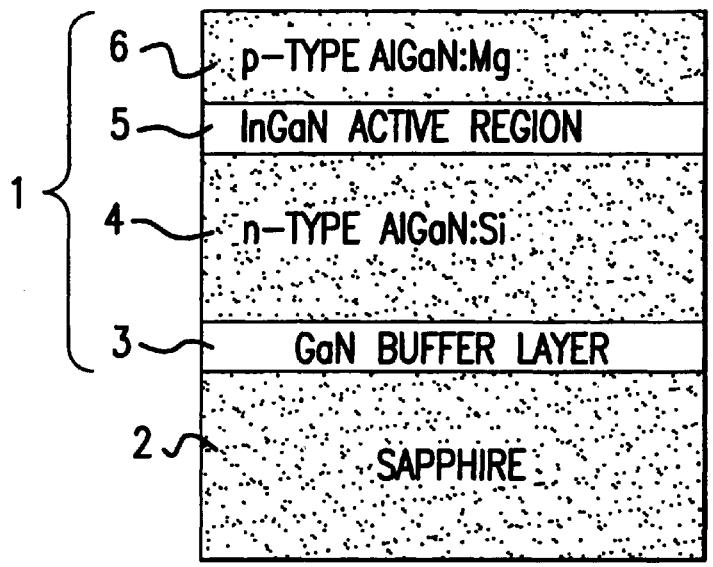
FIGS. 2A–2D illustrate the fabrication with AlGaInN alloys, according to the present invention, of a typical light emitting device structure.

FIGS. 2A–2D illustrate the fabrication according to the present invention of a typical light emitting diode device structure. FIG. 2A shows a multilayer nitride film 1 grown epitaxially on sapphire substrate 2. Multilayer nitride film 1 includes a GaN buffer layer 3 grown directly on sapphire substrate 2. An AlGaN layer 4, doped n-type with Si dopant atoms, is formed on top of GaN buffer layer 2. InGaN active region 5 is grown on AlGaN layer 4. An AlGaN layer 6, doped p-type with Mg dopant atoms, is formed on InGaN active region 5. Nitride film layers 3, 4, 5 and 6 are grown by conventional techniques, such as metal-organic chemical vapor deposition ("MOCVD").

Figure 2B:
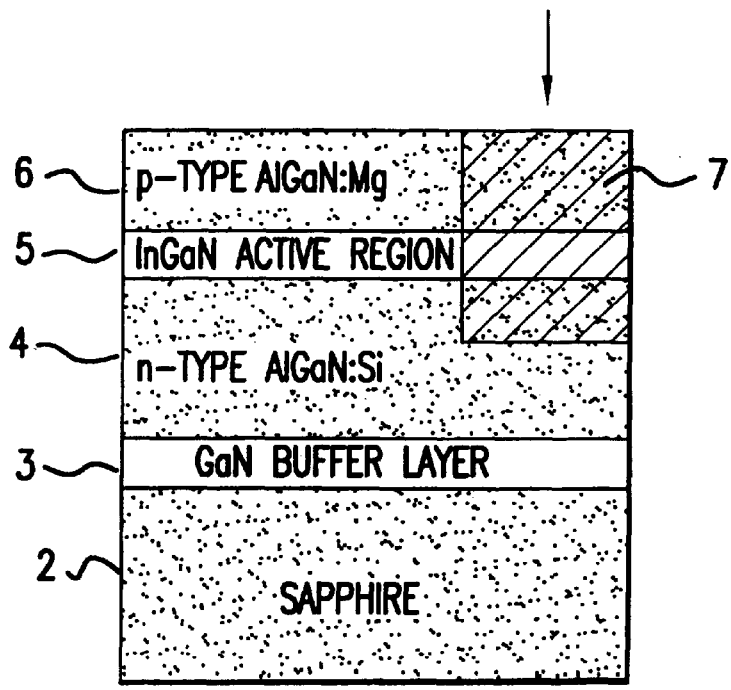

FIG. 2B shows the laminate structure of FIG. 2A after ions, traveling in the direction of the arrow, are implanted in implanted region 7.

Figure 2C:
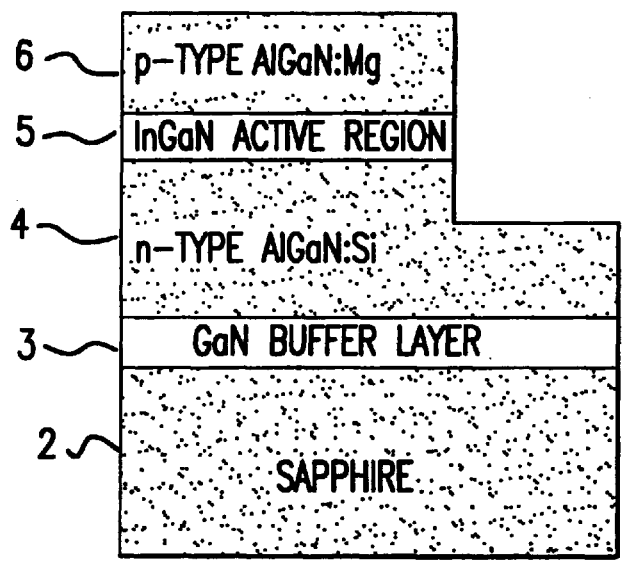

After the laminate structure FIG. 2B is exposed to an etching liquid, such as an aqueous base, region 7 is etched away, resulting in the laminate structure of FIG. 2C.

Figure 2D:
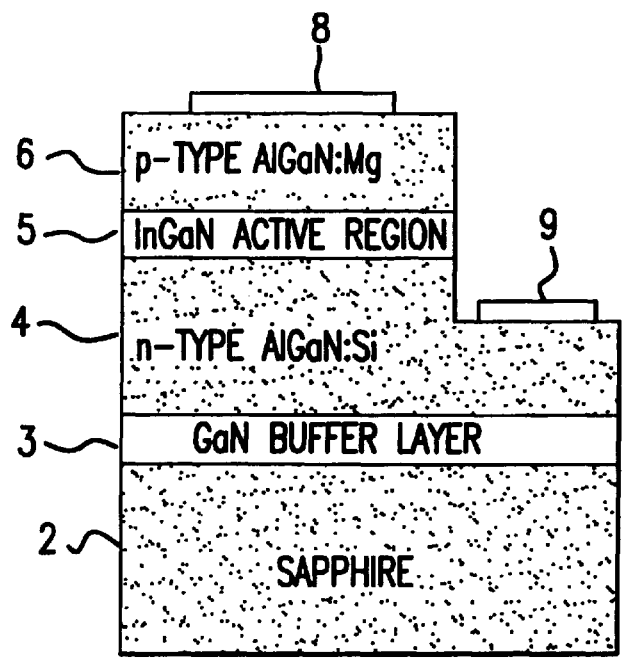

To make electrical contact to opposite sides of the InGaN active region 5, FIG. 2D shows that conventional lithographic and deposition processes are used to form electrical contact 8 on p-type AlGaN layer 6 and electrical contact 9 on n-type AlGaN layer 4.

EXAMPLE 2

Figure 3A:
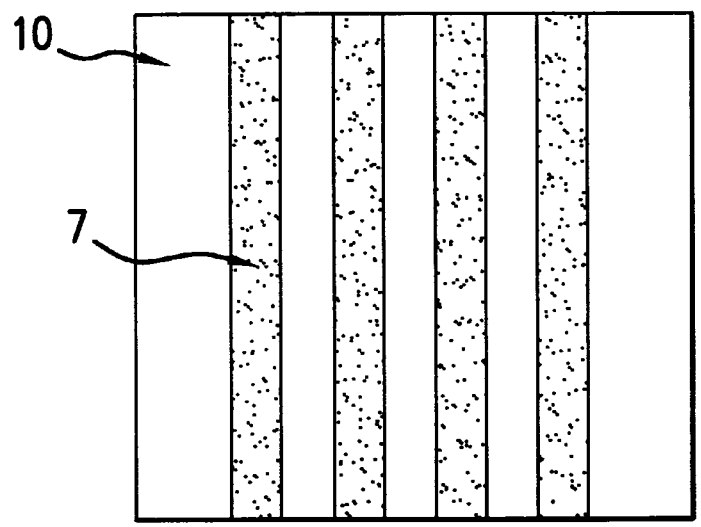
FIG. 3A is a schematic of a GaN sample after ion implantation, but before etching.
Figure 3B:
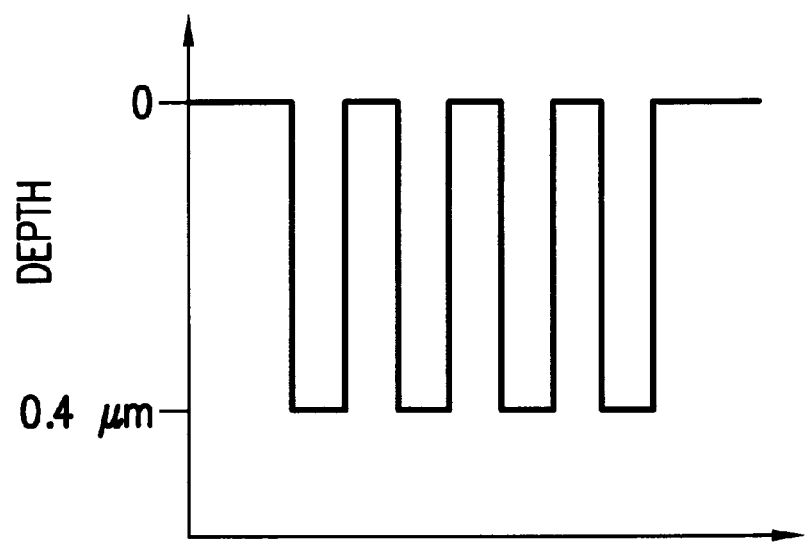
FIG. 3B is a surface profile of the GaN sample in FIG. 3A after etching.

FIG. 3A shows a GaN film after ion-implantation, but before wet etching. During ion implantation, regions 10 were protected with photoresist from the ions. However, regions 7 were not protected from the ions and were implanted with the ions. The implantation introduced significant displacement damage from the surface of the GaN film to the depth of the desired etching. After the photoresist was removed from the GaN film by conventional techniques, the GaN film was wet etched with an etching liquid according to the present invention. The etching liquid etched the regions 7, but not the regions 10. FIG. 3B shows schematically the surface topography of the GaN film of FIG. 3A after wet etching, as conventionally measured with a mechanical stylus.

While this invention has been described in conjunction with various specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention defined in the following claims.

What is claimed is:

1. An etching process comprising:
    implanting ions at selected regions of a film comprising at least one of a III–V nitride and a III–V nitride alloy to form an ion implanted film, the III–V nitride being a nitride formed from elements of Group III and Group V of the periodic table and the III–V nitride alloy being a nitride alloy formed from elements of Group III and Group V of the periodic table; and
    selectively etching the selected regions of the ion implanted film with an etching liquid.

2. The etching process according to claim 1, wherein the step of implanting ions comprises implanting ions at selected regions of a non-implanted film comprising at least one of a III–V nitride and a III–V nitride alloy, the III–V nitride being a nitride formed from elements of Group III and Group V of the periodic table and the III–V nitride alloy being a nitride alloy formed from elements of Group III and Group V of the periodic table.

3. The etching process according to claim 1, wherein the III–V nitride is gallium nitride and the III–V nitride alloy is aluminum gallium indium nitride.

4. The etching process according to claim 1, wherein the film is not doped with p-type dopants or n-type dopants.

5. The etching process according to claim 1, wherein the film is doped p-type or n-type.

6. The etching process according to claim 2, wherein a portion of the non-implanted film is protected from ion implantation by a mask.

7. The etching process according to claim 6, wherein the mask is a layer of photoresist on a surface of the non-implanted film.

8. The etching process according to claim 2, wherein the step of implanting comprises directing an ion beam to the non-implanted film.

9. The etching process according to claim 8, wherein the step of implanting comprises focusing an ion beam on the non-implanted film.

10. The etching process according to claim 2, wherein the step of implanting implants at least one of an elemental ion and a molecular ion in the non-implanted film.

11. The etching process according to claim 10, wherein the elemental ion is selected from the group consisting of Al, Ga, In, Si, O, N, Mg, Zn, $^2$H, H and He ions.

12. The etching process according to claim 2, wherein the step of implanting implants ions having an ion energy from about 5 keV to about 5000 keV in the non-implanted film.

13. The etching process according to claim 12, wherein the step of implanting implants ions having an ion energy from about 75 keV to about 200 keV in the non-implanted film.

14. The etching process according to claim 2, wherein the step of implanting implants ions in the non-implanted film to a dose of between about $10^{11}$ ions/cm$^2$ and about $10^{18}$ ions/cm$^2$.

15. The etching process according to claim 14, wherein the dose is between about $10^{14}$ ions/cm$^2$ and about $10^{15}$ ions/cm$^2$.

16. The etching process according to claim 2, wherein a first region of the non-implanted film is implanted with ions having a first energy, mass and dose; a second region of the non-implanted film is adjacent to the first region of the non-implanted film; the second region of the non-implanted film is implanted with ions having a second energy, mass and dose; and at least one of the second energy, mass and dose is different from the respective first energy, mass and dose.

17. The etching process according to claim 1, wherein the etching liquid comprises an aqueous base.

18. The etching process according to claim 17, wherein the aqueous base comprises at least one of aqueous sodium hydroxide and aqueous potassium hydroxide.

19. The etching process according to claim 1, wherein the etching liquid is at or above a temperature of about 25° C.

20. The etching process according to claim 19, wherein the etching liquid is at a temperature between about 25° C. and about 400° C.

21. an etching process, comprising:
providing an ion implanted film comprising at least one of gallium nitride and aluminum gallium indium nitride; and
etching the ion implanted film with an etching liquid.

* * * * *